(12) United States Patent
Srivastava

(10) Patent No.: US 11,024,358 B1
(45) Date of Patent: Jun. 1, 2021

(54) DIFFERENTIAL COMPUTE-IN-MEMORY BITCELL

(71) Applicant: QUALCOMM Incorporated, San Diego, CA (US)

(72) Inventor: Ankit Srivastava, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 16/885,148

(22) Filed: May 27, 2020

(51) Int. Cl.
| | |
|---|---|
| *G11C 11/24* | (2006.01) |
| *G11C 11/404* | (2006.01) |
| *G11C 11/4074* | (2006.01) |
| *G11C 11/4096* | (2006.01) |
| *G11C 11/4094* | (2006.01) |
| *G11C 11/408* | (2006.01) |

(52) U.S. Cl.
CPC ...... *G11C 11/4045* (2013.01); *G11C 11/4074* (2013.01); *G11C 11/4085* (2013.01); *G11C 11/4094* (2013.01); *G11C 11/4096* (2013.01)

(58) Field of Classification Search
CPC ............ G11C 11/4045; G11C 11/4074; G11C 11/4085; G11C 11/4094; G11C 11/4096
USPC ......................................................... 365/149
See application file for complete search history.

(56) References Cited

U.S. PATENT DOCUMENTS

| | | | |
|---|---|---|---|
| 9,722,828 B2 * | 8/2017 | Sun ..................... | H04L 25/0292 |
| 2021/0005230 A1 * | 1/2021 | Wang .................. | G11C 7/1063 |

* cited by examiner

*Primary Examiner* — Huan Hoang
(74) *Attorney, Agent, or Firm* — Haynes and Boone, LLP

(57) ABSTRACT

A compute-in-memory bitcell is provided that includes a pair of cross-coupled inverter for storing a stored bit. The compute-in-memory bitcell includes a logic gate for multiplying the stored bit with an input vector bit. An output node for the logic gate connects to a second plate of a positive capacitor. A first plate of the positive capacitor connects to a positive read bit line. An inverter inverts a voltage of the second plate of the positive capacitor to drive a first plate of a negative capacitor having a second plate connected to a negative read bit line.

28 Claims, 10 Drawing Sheets

700 — closing a first switch to connect a positive read bit line to a power supply node for a power supply voltage and closing a second switch to connect a negative read bit line to ground 705 — maintaining the first switch and the second switch in a closed state 710 — responsive to a binary product of a filter weight bit and an input bit being true, charging a second plate of a positive capacitor to the power supply voltage while a first plate of the positive capacitor is connected to the positive read bit line and discharging a second plate of a negative capacitor to ground while a first plate of the negative capacitor is connected to the negative read bit line 715 — discharging the second plate of the positive capacitor while the first switch is opened to provide a first accumulation voltage on the positive read bit line 720 — charging the second plate of the negative capacitor to the power supply voltage while the second switch is opened to provide a second accumulation voltage on the negative read bit line

DIFFERENTIAL COMPUTE-IN-MEMORY BITCELL

TECHNICAL FIELD

This application relates to compute-in-memories, and more particularly to a differential compute-in-memory bitcell.

BACKGROUND

Computer processing of data typically uses a Von Neumann architecture in which the data is retrieved from a memory to be processed in an arithmetic and logic unit. In computation-intensive applications such as machine learning, the data flow from and to the memory becomes a bottleneck for processing speed. To address this data-movement bottleneck, compute-in-memory architectures have been developed in which the data processing hardware is distributed across the bitcells.

SUMMARY

In accordance with a first aspect of the disclosure, a compute-in-memory bitcell is provided that includes: a pair of cross-coupled inverters having a first output node for a stored filter weight bit; a first read bit line; a second read bit line; a word line having a voltage responsive to an input bit; a first capacitor having a first plate connected to the first read bit line; a second capacitor having a first plate connected to the second read bit line; a first pass transistor connected between the first output node and a second plate of the first capacitor and having a gate connected to the word line; and an inverter having an input connected to the second plate of the first capacitor and having an output connected to a second plate of the second capacitor.

In accordance with a second aspect of the disclosure, a compute-in-memory bitcell is provided that includes: a pair of cross-coupled inverters having a first output node for a stored bit; a first read bit line; a second read bit line; a first capacitor having a first plate connected to the first read bit line; a second capacitor having a first plate connected to the second read bit line; a first transmission gate connected between the first output node and a second plate of the first capacitor, wherein the first transmission gate is responsive to an input bit; and an inverter having an input connected to the second plate of the first capacitor and having an output connected to a second plate of the second capacitor.

In accordance with a third aspect of the disclosure, a multiply-and-accumulate circuit is provided that includes: a plurality of compute-in-memory bitcells arranged into a plurality of columns, wherein each column includes a first read bit line and a second read bit line, and wherein each compute-in-memory bitcell in each column includes: a logic gate configured to multiply an input bit with a stored bit; a first capacitor having a first plate connected to the column's first read bit line and having a second plate connected to an output node for the logic gate; a second capacitor having a first plate connected to the column's second read bit line; and an inverter having an input connected to the second plate of the first capacitor and having an output connected to a second plate of the second capacitor.

In accordance with a fourth aspect of the disclosure, a compute-in-memory method is provided that includes: during a reset phase, closing a first switch to connect a positive read bit line to a power supply node for a power supply voltage and closing a second switch to connect a negative read bit line to ground; during a calculation phase following the reset phase: maintaining the first switch and the second switch in a closed state; and responsive to a binary product of a filter weight bit and an input bit being true, charging the second plate of a positive capacitor to the power supply voltage while a first plate of the positive capacitor is connected to the positive read bit line and discharging a second plate of a negative capacitor to ground while a first plate of the negative capacitor is connected to the negative read bit line; during an accumulation phase following the calculation phase: discharging the second plate of the positive capacitor while the first switch is opened to provide a first accumulation voltage on the charged positive read bit line; and charging the second plate of the negative capacitor to the power supply voltage while the second switch is opened to provide a second accumulation voltage on the discharged negative read bit line.

These and other advantageous features may be better appreciated through the following detailed description.

BRIEF DESCRIPTION OF THE DRAWINGS

FIG. 7 is a flowchart of an example method of operation for a differential compute-in-memory bitcell.

Embodiments of the present disclosure and their advantages are best understood by referring to the detailed description that follows. It should be appreciated that like reference numerals are used to identify like elements illustrated in one or more of the figures.

DETAILED DESCRIPTION

Figure 1A:
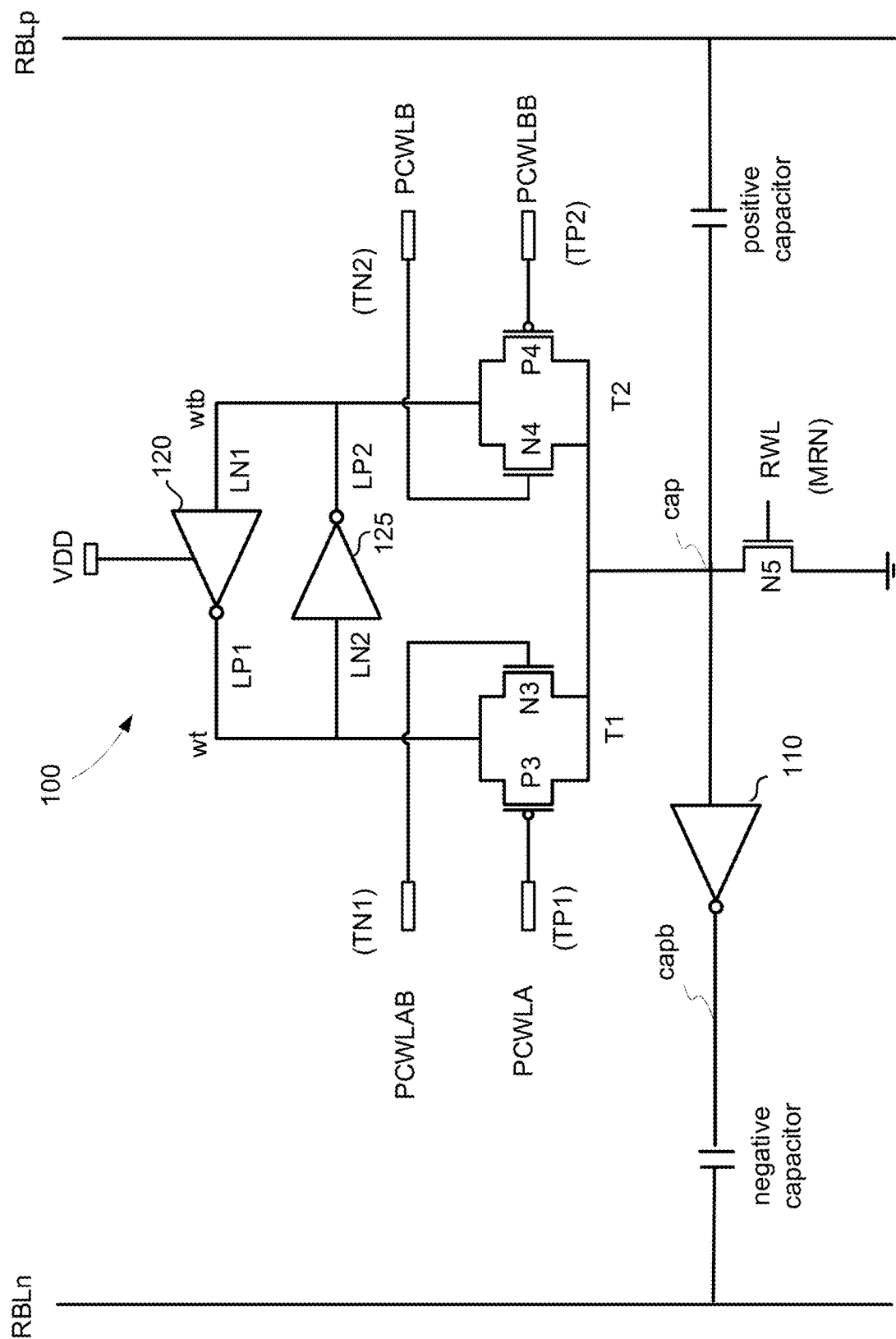
FIG. 1A illustrates a first differential compute-in-memory bitcell in accordance with an aspect of the disclosure.

In deep learning and other machine learning applications, a convolutional layer is a fundamental building block. A convolutional layer includes a collection of nodes for the multiplication of filter weights with an input vector from a previous layer (or from input data such as an image being analyzed). The nodes may also be designated as neurons. To increase the processing speed, the nodes are implemented using compute-in-memory bitcells. A compute-in-memory bitcell not only stores a binary filter weight but also includes a logic gate to perform the multiplication of the stored binary filter weight with the corresponding input bit. Within a convolutional layer, a collection of compute-in-memory bitcells that are organized into a compute-in-memory (CiM) multiply-and-accumulate (MAC) circuit are designated as a filter. The terms "filter" and "CIM MAC circuit" are thus used interchangeably herein. The output of the CiM MAC circuit represents the multiplication of the stored filter weight bits with the corresponding input bits for the filter. For example, suppose the filter has the dimensions of 2 by 2 by 2. There are thus eight filter weights in such a filter that are multiplied by the corresponding inputs. The resulting CiM MAC circuit performs eight multiplications and sums them to form a MAC output voltage that is digitized to provide an output signal that is propagated to the next layer.

Consider the example of a machine learning application for image analysis. The image is represented by a collection of pixels that form the input vector to a corresponding filter. The filter is convolved across the image. As a result of this convolution, the input vector to a filter is successively changed. The analog filter output signal (the conventional analog CiM MAC circuit output signal) will thus have a distribution about a neuron bias point. The neuron bias varies considerably from layer to layer and carries no information. Instead, the information is contained in the filter output deviation from the neuron bias. But the neuron bias may be rail-to-rail (from ground to the power supply voltage). This rail-to-rail behavior of the neuron bias complicates the design of an analog-to-digital converter for converting the analog filter output signal into a digital output signal that may be propagated from the layer containing the filter to the subsequent layer.

To solve the issues caused by the neuron bias, a particularly advantageous analog CiM MAC circuit is disclosed that provides a differential (ground to the power supply voltage) filter output voltage for low-power deep learning and other artificial intelligence applications. Because the filter output is differential, the neuron bias is removed. In addition, the differential filter output provides an improved signal-to-noise ratio as compared to a conventional single-ended filter output.

Each CiM bitcell with the analog CiM MAC circuit is a differential CiM bitcell that includes an SRAM cell storing a filter weight bit using two cross-coupled inverters. One of the cross-coupled inverters drives a filter weight (wt) output node with the filter weight bit whereas the remaining cross-coupled inverter drives a complement filter weight (wtb) output node with a complement of the filter weight bit. The filter weight output node couples through a first transmission gate to a first capacitor node. Similarly, the complement filter weight output node couples through a second transmission gate to the first capacitor node. The first capacitor node connects to a second plate of a first capacitor. The first capacitor also includes a first plate connected to a first read bit line. As used herein, "connected" refers to a direct electrical connection although such a direct connection may be accomplished through an intervening element such as a resistor, a capacitor, or an inductor. The first capacitor node also couples through an inverter to a second capacitor node. Given the inversion through the inverter, a voltage of the second capacitor node is complement of a voltage of the first capacitor node. A second capacitor has a first plate connected to the second read bit line and a second plate connected to the second capacitor node.

Prior to a calculation phase for the differential compute-in-memory bitcell, the first capacitor node is pre-charged in a pre-charge (reset) phase. The first and second read bit lines are also pre-charged but in a complementary fashion. Thus, if the first read bit line is pre-charged to a power supply voltage, the second read bit line is discharged during the reset phase. Conversely, if the first read bit line is discharged during the reset phase, the second read bit line is charged to the power supply voltage.

The charging of the first capacitor node during the reset phase depends upon the embodiment for the differential compute-in-memory cell. In a pre-charge high embodiment, the first capacitor node is charged to the power supply voltage during the reset phase. In such a pre-charge high embodiment, the first capacitor node may be referred to as a positive capacitor node. Conversely, the first capacitor node may be referred to as a negative or complement capacitor node in a pre-charge low embodiment in which the first capacitor node is discharged during the reset phase. The second capacitor node would thus be the positive capacitor node in a pre-charge low embodiment. Just like the first capacitor node, the first capacitor be deemed to be a positive capacitor or a negative capacitor depending upon whether the differential compute-in-memory bitcell is implemented in a pre-charge high or a pre-charge low embodiment. In a pre-charge high embodiment, the first capacitor may be denoted as a positive capacitor. The first read bit line may also be denoted as a positive read bit line in the pre-charge high embodiment since the first read bit line is also charged to the power supply voltage in the pre-charge high embodiment. The pre-charge high and pre-charge low embodiments are discussed further below.

An input vector bit (which is typically denoted as an activation bit in the machine learning arts in an analogy to a biological neuron) controls whether the first and second transmission gates are open and closed. This control by the activation bit is complementary such that if the activation bit is true, one of the transmission gates is open but the remaining one of the transmission gates is closed. If the activation bit is false, then the open and closed states for the transmission gates is reversed from the true activation bit state configuration.

During a calculation phase following the reset phase, the activation bit controls whether the first and second transmission gates are open or closed during the calculation phase. If the activation bit is true, the first transmission gate is closed while the second transmission gate is opened. In that case, suppose that the stored filter weight bit is also true so that the filter weight output node is charged to the power supply VDD. This high state for the filter weight output node then conducts through the closed first transmission gate to charge the first capacitor node. If the filter weight output node is discharged and the first transmission gate closed, the first capacitor node is discharged. Conversely, the first transmission gate is opened while the second transmission gate is closed during the calculation phase if the activation bit is false. In that case, suppose that the stored filter weight bit is also false so that the complement filter weight output node is charged to the power supply VDD. This high state for the complement filter weight output node then conducts through the closed second transmission gate to charge the first capacitor node to the power supply voltage VDD. These advantageous features of a differential CiM SRAM bitcell may be better appreciated through a consideration of some following example embodiments.

Turning now to the drawings, an example pre-charge high differential CiM SRAM bitcell 100 is shown in FIG. 1A. Bitcell 100 includes a pair of cross-coupled inverters 120 and 125 for the storing of a filter weight bit. Inverter 120 inverts the voltage of a complement filter weight output node (wtb) to drive a voltage of a filter weight output node (wt). Similarly, inverter 125 inverts the voltage of the filter weight output node wt to drive the voltage of the complement filter weight output node wtb. The filter weight output node couples through a first transmission gate T1 to a positive capacitor node (cap). Similarly, the complement filter weight output node couples through a second transmission gate T2 to the positive capacitor node. The positive capacitor node connects to a second plate of a positive capacitor. A first plate of the positive capacitor connects to a positive read bit line (RBLp). The capacitor node also couples through an inverter 110 to a complement capacitor node (capb). The complement capacitor node connects to a second plate of a negative capacitor. A first plate of the negative capacitor connects to a negative read bit line (RBLn).

An NMOS reset transistor N5 has a source connected to ground and a drain connected to the capacitor node. In some embodiments, the various transistors disclosed herein such as reset transistor N5 may all be thick-oxide transistors to limit leakage. A read word line RWL connects to a gate of reset transistor N5. Prior to a calculation phase, the positive capacitor and the negative capacitor are both reset in a reset phase. During the reset phase, the positive read bit line is charged to the power supply voltage VDD. Conversely, the negative read bit line is discharged to ground during the reset phase. The read word line RWL is charged to the power supply voltage VDD during the reset phase so that reset transistor N5 switches on to ground capacitor node. This ground state for the positive capacitor node is inverted through inverter 110 so that the complement capacitor node is charged to the power supply voltage VDD during the reset phase. Both the positive capacitor and the negative capacitor are thus both charged to the power supply voltage VDD during the reset phase. In addition, both the transmission gates T1 and T2 are opened during the reset phase.

The calculation phase follows the reset phase. In the calculation phase, an activation bit controls the transmission gates T1 and T2. Transmission gate T1 is formed by a p-type metal-oxide semiconductor (PMOS) transistor P3 in parallel with an n-type metal-oxide semiconductor (NMOS) transistor N3. The source of transistor P3 and the drain of transistor N3 are both connected to the filter weight output node (the output of inverter 120). Similarly, the drain of transistor P3 and the source of transistor N3 connect to the capacitor node. Transmission gate T2 is analogous in that transmission gate T2 is formed by a parallel combination of a PMOS transistor P4 and an NMOS transistor N4. The source of transistor P4 and the drain of transistor N4 are both connected to the complement filter weight output node (the output of inverter 125). Similarly, the drain of transistor P3 and the source of transistor N4 connect to the positive capacitor node.

To control the transmission gates, the activation bit controls a voltage of a pre-charge word line PCWLA that drives a gate of transistor P3 in first transmission gate T1. The complement of the activation bit controls a voltage of a pre-charge complement word line PCWLAB that drives a gate of transistor N3 in that same first transmission gate T1. The control of the second transmission gate T2 is complementary since the activation bit also controls the voltage of a pre-charge word line PCLWB that drives a gate of transistor N4. Similarly, the complement of the activation bit controls a voltage of a pre-charge complement word line PCWLBB that drives a gate of transistor P4. The read word line is de-asserted during the calculation phase so that the positive capacitor node floats with respect to ground. Which transmission gate is opened or closed during the calculation phase depends upon whether the activation bit is \active-low or active-high. In an active-low embodiment, the pre-charge word line PCWLA is discharged if the activation bit is true. At the same time, the pre-charge complement word line PCWLAB is then charged high to the power supply voltage VDD. Both transistors P3 and N3 in the first transmission gate T1 will thus be switched on such that this first transmission gate T1 is closed to connect the filter weight output node to the positive capacitor node. If the filter weight bit is true, the second plate of the positive capacitor C will thus be charged to the power supply voltage VDD to discharge the positive capacitor. At the same time, the second plate of the negative capacitor would be discharged to discharge the negative capacitor. The control of transmission gates T1 and T2 depends upon whether the input vector is active-low or active-high. In an active-low embodiment, the pre-charge word line PCWLB is discharged if the activation bit is true so that transmission gate T2 is opened. Conversely, transmission gate T2 is closed if the activation bit is false in the active-low embodiment.

The resulting multiplication of the filter weight bit wt with the activation bit in an active-low embodiment for the activation bit is thus an XNOR operation with respect to the charging of the positive capacitor node since the positive capacitor node (and thus the second plate of the positive capacitor) will be charged if both these bits have the same binary value. On the other hand, the multiplication would an XOR with respect to the charging of the positive capacitor node if the activation bit is an active-high signal. Due to the inversion through inverter 110, the charging of the complement capacitor node is an XOR of the filter weight bit wt and the activation bit if the activation bit is an active-low signal. Conversely, the charging of the complement capacitor node is an XNOR of the filter weight bit and the activation bit if the activation bit is an active-high signal.

Prior to the reset phase and the calculation phase, the filter weight bit is written into bitcell 100 in a write phase. During the write phase, the read word line is asserted to ground the positive capacitor node. Depending upon the binary value of the filter weight bit being written into bitcell, one of the transmission gates T1 and T2 is switched on (closed) while the other one of the transmission gates is switched off (opened). For example, if the filter weight bit is to be a binary one, it is transmission gate T2 that is switched on. The ground through reset transistor N5 then flows through transmission gate T2 to drive the input to inverter 120, which then asserts the filter weight output node to the power supply voltage VDD to latch the binary-high state for the filter weight bit wt0. Conversely, if the filter weight bit is to be a binary zero, it is transmission gate T1 that is switched on. The ground through reset transistor N5 then flows through transmission gate T1 to drive the input node for inverter 125. The complement filter weight bit output node is thus driven high to the power supply voltage VDD to latch the binary zero into bitcell 100. Transmission gates T1 and T2 are thus controlled in a complementary fashion during both the write phase and the calculation phase. But both of these transmission gates are switched off during the reset phase so that the grounding of the capacitor node does not disturb the stored state for the stored filter weight bit.

Figure 1B:
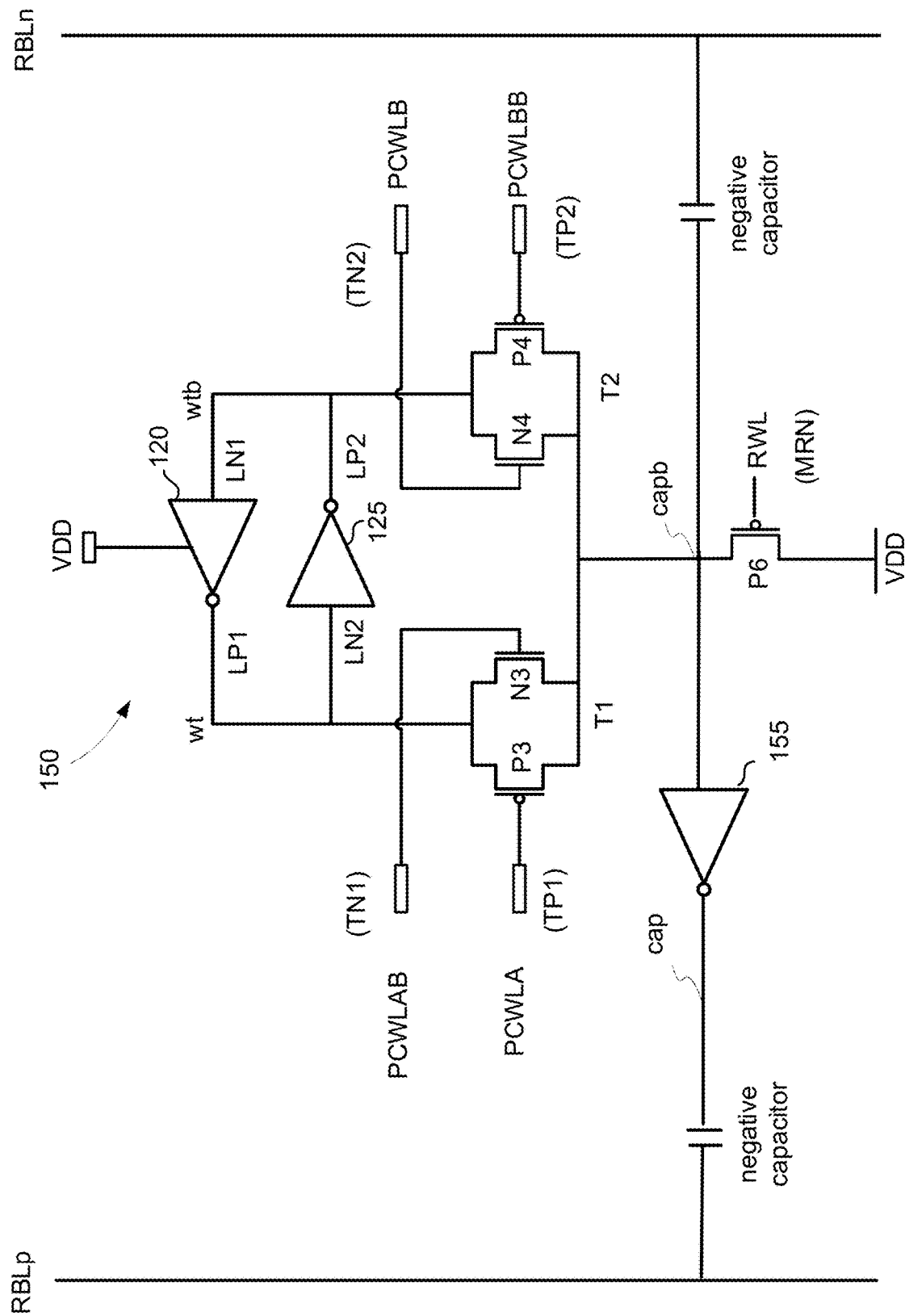
FIG. 1B illustrates a second differential compute-in-memory bitcell in accordance with an aspect of the disclosure.

The locations of the positive read bit line and the negative read bit line as well as the locations of the positive capacitor and the negative capacitor are reversed in a pre-charge low embodiment such as shown in FIG. 1B for a pre-charge low differential compute-in-memory bitcell 150. Transmission gates T1 and T2 couple their respective output nodes to the complement capacitor node (capb) in bitcell 150. An inverter 155 inverts a voltage of the complement capacitor node to drive the positive capacitor node (cap). Referring again to the more generic description of a differential bitcell with a first capacitor and a second capacitor, the first capacitor is the negative capacitor in bitcell 150 whereas the second capacitor is the positive capacitor. The first read bit line is the negative read bit line. The second read bit is the positive read bit line. Although the locations of the positive and negative read bit lines are reversed in bitcell 150, these read bit lines are pre-charged as discussed for bitcell 100. Thus, it is the positive read bit line that is pre-charged to the power supply voltage in bitcell 150. Similarly, it is the negative read bit line that is discharged in bitcell 150 during the reset phase. The pre-charging of the positive and negative capacitor nodes in bitcell 150 are also as discussed for bitcell 100.

In bitcell 150, a PMOS reset transistor P6 has a source connected to a power supply node for the power supply voltage VDD and a drain connected to the negative capacitor node. During the reset phase, an active-low negative read word line (RWLn) is asserted to switch on reset transistor P6 to pre-charge the negative capacitor node to the power supply voltage VDD. As defined herein, a binary voltage signal is deemed to be asserted when the voltage signal is true. An active-low signal is thus asserted when it is discharged whereas an active-high signal is asserted to the power supply voltage to indicate the true state. During the calculation phase, reset transistor P6 is switched off. In the accumulation phase, reset transistor P6 is switched back. The operation of reset transistor P6 is thus analogous to the operation of reset transistor N5.

Figure 2:
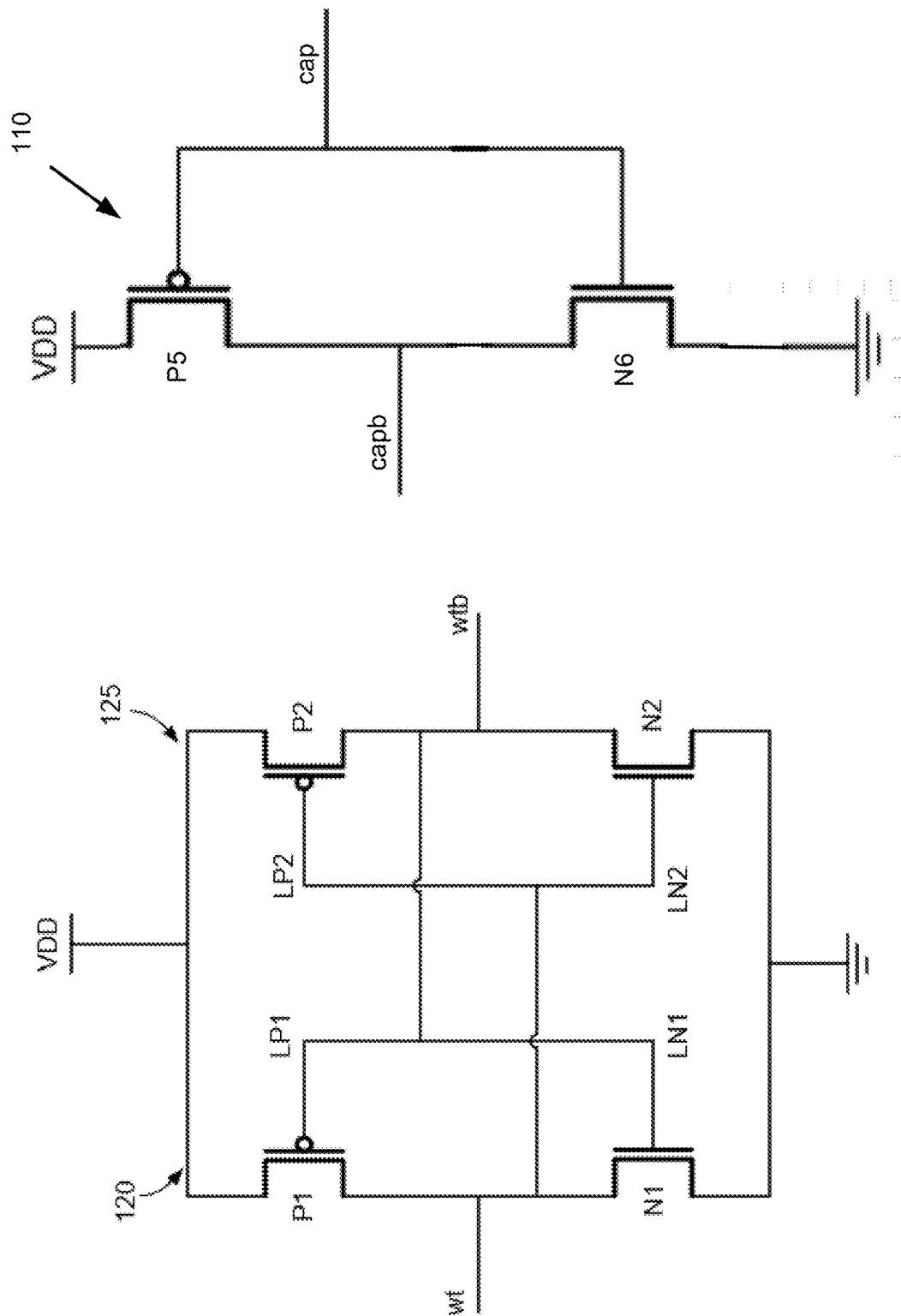
FIG. 2 illustrates a pair of cross-coupled inverter and an inverter in the first differential compute-in-memory bitcell of FIG. 1A.

Cross-coupled inverters 120 and 125 for bitcells 100 and 150 are shown in more detail in FIG. 2. Each inverter is formed by a p-type metal-oxide-semiconductor (PMOS) transistor in series with an n-type metal-oxide-semiconductor (NMOS) transistor. For example, inverter 120 is formed by a PMOS transistor P1 in series with an NMOS transistor N1. A source of transistor N1 connects to ground whereas a drain of transistor N1 connects to a drain of transistor P1. A source of transistor P1 connects to a power supply node. The drains of transistor P1 and N1 form the filter weight output node for inverter 120 over which inverter 120 drives the filter weight bit. Inverter 125 is analogous in that it is formed by a PMOS transistor P2 in series with an NMOS transistor N2. A source of transistor N2 connects to ground whereas a drain of transistor N2 connects to a drain of transistor P2. A source of transistor P2 connects to the power supply node. The drains of transistor P2 and N2 form the complement filter weight output node for inverter 125 over which inverter 125 drives a complement filter weight bit. To complete the cross-coupling, the filter weight output node of inverter 120 connects to the gates for transistors N2 and P2 whereas the complement filter weight output node of inverter 125 connects to the gate for transistors N1 and P1.

Inverter 110 is also shown in more detail in FIG. 2. Inverter 155 is constructed analogously. Inverter 110 is formed by PMOS transistor P5 in series with an NMOS transistor N6. A source of transistor N6 connects to ground whereas a drain of transistor N6 connects to a drain of transistor P5. A source of transistor P5 connects to the power supply node. The drains of transistors P5 and N6 connect to the complement capacitor node (the output node for inverter 110) whereas the capacitor node connects to the gates of transistor P5 and N6 (the input node for inverter 110).

Figure 3:
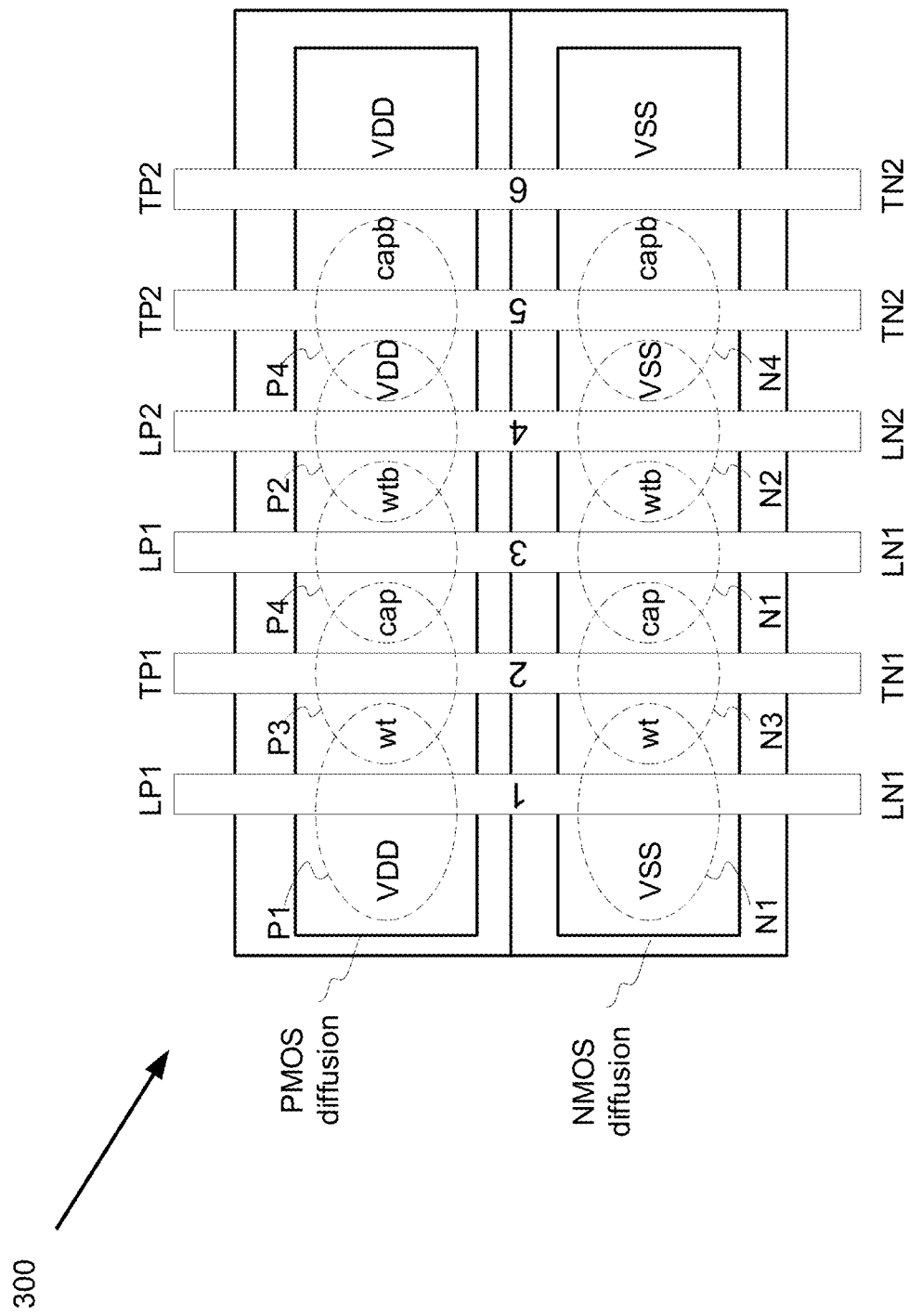
FIG. 3 illustrates a semiconductor layout for a first portion of the first differential compute-in-memory bitcell of FIG. 1A.

An example layout for bitcell 100 will now be discussed in more detail. Transistors P1, N1, P2, N2, P3, N3, P4, N4, P5, and N6 may be laid out on a semiconductor substrate within a 6-poly pitch as shown in FIG. 3 to form a bitcell portion 300. The poly lines for these transistors are numbered from 1 through 6. The PMOS transistors are formed on a PMOS diffusion region whereas the NMOS transistors are formed on an NMOS diffusion region. The intersection of a poly line with the NMOS or PMOS diffusion regions forms a gate for a corresponding NMOS or PMOS transistor. Referring again to FIG. 2, the gate for transistor P1 in inverter 120 may be labeled as corresponding to a poly gate region LP1. Similarly, the gate for transistor N1 in inverter 120 is labeled as corresponding to a poly gate region LN1. This same nomenclature is used in FIG. 3. A gate for transistor P1 in bitcell 100 is thus formed by a poly gate region LP1 in poly line 1. A VDD node in the PMOS diffusion region adjacent to poly gate region LP1 forms the source for transistor P1 whereas a filter weight bit (wt) node in the PMOS diffusion region adjacent to poly gate region LP1 forms the drain. In bitcell 100, this weight bit node is the filter weight bit output node for inverter 120. Transistor N1 for inverter 120 is analogous in that its gate is formed by a poly gate region LN1 in poly line 1 (note that a poly cut that is not shown isolates poly gate regions LP1 and LN1 in poly line 1). The source of transistor N1 is formed by a VSS (ground) node in the NMOS diffusion region adjacent to poly line 1. Similarly, the drain of transistor N1 is formed by a filter weight output node (wt) in NMOS diffusion region on the other side of poly line 1.

Referring again to FIG. 2, the gate for transistor P2 in inverter 125 may be labeled as corresponding to a poly gate region LP2. Similarly, the gate for transistor N2 in inverter 125 is labeled as corresponding to a poly gate region LN2. This same nomenclature is again used in FIG. 3. A gate for transistor P2 is thus formed by a poly gate region LP2 in poly line 4 for bitcell 100. A VDD node in the PMOS diffusion region adjacent to this poly gate region LP2 forms the source for this transistor P2 whereas a complement filter weight bit output node (wtb) in the PMOS diffusion region adjacent to poly gate region LP2 forms the drain. Transistor N2 for inverter 125 is analogous in that its gate is formed by a poly gate region LN2 in poly line 4. A source for transistor N2 is formed by a VSS (ground) node in the NMOS diffusion region on one side of poly line 4 whereas a drain for transistor N2 is formed by a complement filter weight output node (wtb) in the NMOS diffusion region on the other side of poly line 4.

Referring again to FIG. 1A, a gate node for transistor P3 in transmission gate T1 may be denoted as TP1. Similarly, a gate node for transistor N3 in transmission gate T1 may be denoted as TN1. Poly line 2 for bitcell 100 in FIG. 3 thus forms a corresponding poly gate region TP1 for transistor P3 and forms a corresponding poly gate region TN1 for transistor P3. As seen in FIG. 1A, a gate node for transistor P4 in transmission gate T2 may be denoted as TP2 whereas a gate node for each transistor N4 in each second transmission gate T2 may be denoted as TN2. Poly line 3 for bitcell 105 in FIG. 3 thus forms a corresponding poly gate region TP2 for transistor P4 and forms a corresponding poly gate region TN2 for transistor N4. The gates for transistors P5 and N6 in inverter 110 are formed by a poly line 5. Note that bitcell 100 will be repeated numerous times across the semiconductor die. Since these additional copies of bitcell 100 will have analogous layouts that being with a VDD and VSS region in the PMOS and NMOS diffusion regions, respectively, bitcell 100 does not end with poly line 5 but instead ends at a poly line 6 so that an additional VDD node and VSS node may abut the neighboring bitcell (the neighboring bitcell is not shown in FIG. 3 for illustration clarity).

Figure 4:
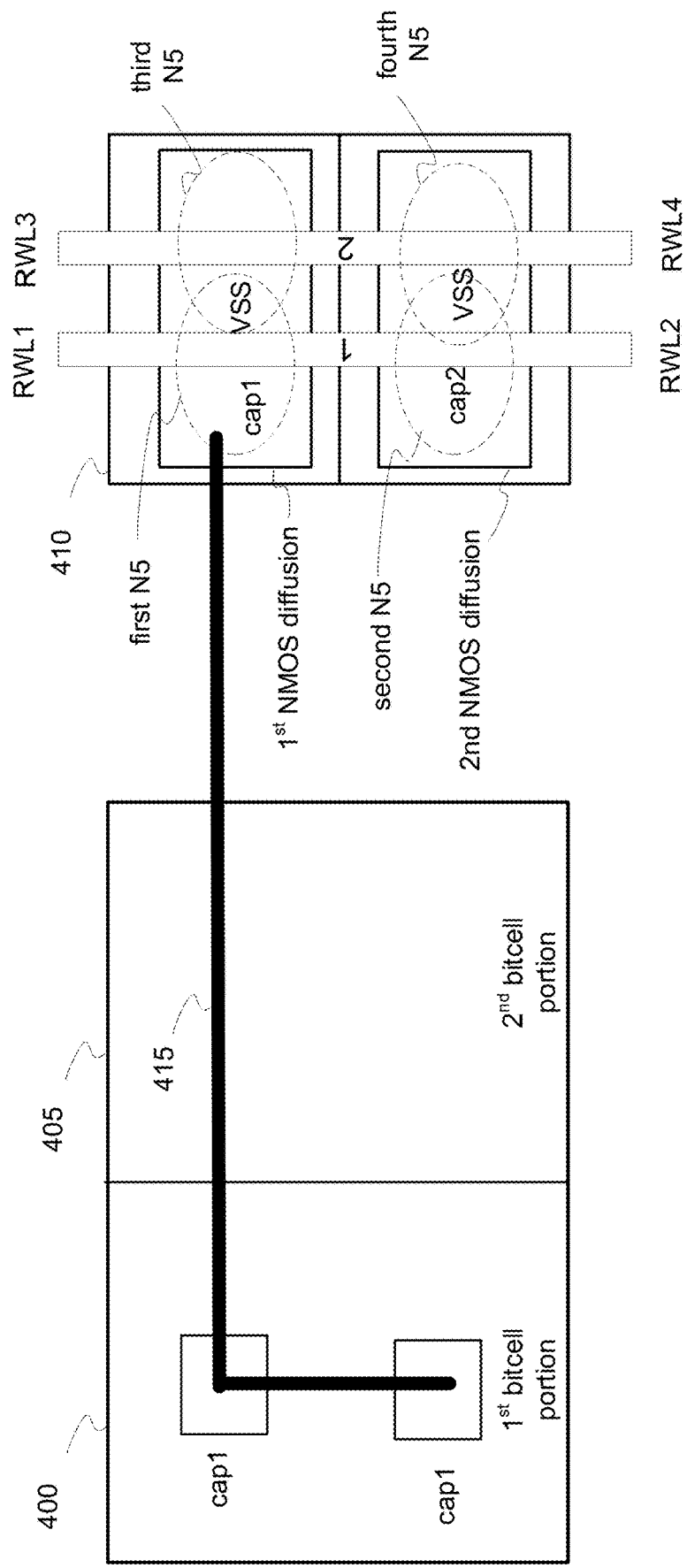
FIG. 4 illustrates a semiconductor layout for a second portion of the first differential compute-in-memory bitcell of FIG. 1A.

Note that reset transistor N5 does not fit within the six-poly pitch for transistors P1, N1, P2, N2, P3, N3, P4, N4, P5, and N6 in bitcell portion 300. Reset transistor N5 can thus be formed in an adjacent portion of the semiconductor die having multiple NMOS diffusion regions. For example, transistors P1, N1, P2, N2, P3, N3, P4, N4, P5, and N6 may be formed in a first bitcell portion 400 for a first bitcell that neighbors a second bitcell portion 405 for a second bitcell as shown in FIG. 4. First and second bitcell portions 400 and 405 are formed as discussed with regard to bitcell portion 300. A semiconductor die region 410 includes a first NMOS diffusion region and a second NMOS diffusion region for forming the two N5 reset transistors for the two bitcell portions 400 and 405. For example, the capacitor node in first bitcell portion 400 may be denoted as a first capacitor node (cap1). The cap1 nodes for first bitcell portion 400 couple through a metal layer lead 415 to a cap1 node for a first N5 transistor formed in the first NMOS diffusion region in semiconductor die region 410. As known in the semiconductor arts, multiple metal layers are formed adjacent the semiconductor die and may be patterned into leads such as metal layer lead 415. A first polysilicon (poly) line 1 forms a gate for the first N5 transistor. A first read word line (RWL1) controls the gate of the first N5 transistor. The first NMOS diffusion region also forms a ground node (VSS) for the first N5 transistor. Second bitcell portion 405 includes a second capacitor node (not illustrated) that would have an analogous coupling to a cap2 node for a second N5 transistor formed in the second NMOS diffusion region at the intersection with the first poly line. A second read word line (RWL2) controls the gate of the second N5 transistor. The VSS node for the first N5 transistor may be shared with a third N5 transistor for a third bitcell portion (not illustrated). Similarly, the VSS node for the second N5 transistor may be shared with a fourth N5 transistor for a fourth bitcell portion (not illustrated). The third and fourth N5 transistors are formed at the intersection of a second poly line with the first and second NMOS diffusion regions, respectively. A third read word line (RWL3) controls the gate of the third N5 transistor. Similarly, a fourth read word line (RWL4) controls the gate of the fourth N5 transistor. It will be appreciated that semiconductor region may include additional NMOS diffusion regions to form additional N5 transistors. For example, if a third NMOS diffusion region were provided, semiconductor die region 410 would support six N5 transistors for six corresponding bitcells. In such an embodiment, three of the bitcells may be on one side of region 410 whereas another three bitcells would be on the opposing side. A layout for bitcell 150 is analogous to the layout of bitcell 100 although it is PMOS transistor P6 instead of transistor N5 that does not fit within the six-poly-line pitch for the remainder of bitcell 150.

Figure 5:
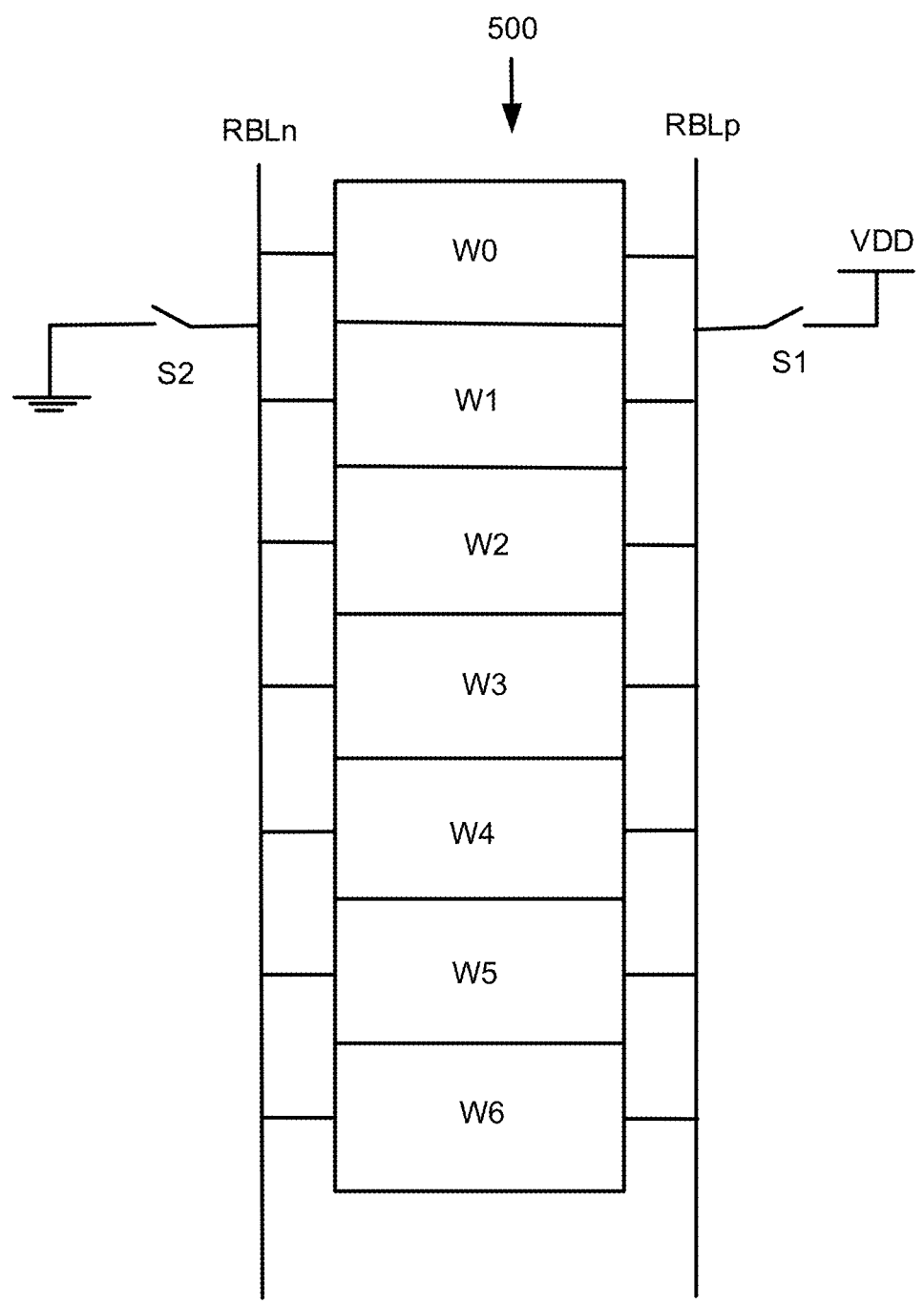
FIG. 5 illustrates a multiply-and-accumulate circuit having a plurality of differential compute-in-memory bitcells in accordance with an aspect of the disclosure.

An example MAC circuit 500 shown in FIG. 5 will now be discussed. MAC circuit 500 includes a plurality of differential CiM bitcells arranged such as discussed for CiM bitcells 100 or 150. In general, the number of bitcells included in MAC circuit 500 will depend upon the filter size. For illustration clarity, MAC circuit 500 is shown in including just seven differential bitcells ranging from a zeroth bitcell storing a zeroth filter weight bit W0 to a sixth bitcell storing a six-filter weight bit W6. Each bitcell operates as discussed with regard to differential bitcell 100 or 150 during the write phase, the reset phase, and the calculation phase. An accumulation phase follows the calculation phase for each bitcell. During the reset phase and the calculation phase, the positive read bit line (RBLp) is charged to the power supply voltage VDD through the closing of a switch S1 that couples between the positive read bit line and a power supply node for the power supply voltage VDD. Similarly, a switch S2 coupled between ground and the negative read bit line (RBLn) closes during the reset phase and the calculation phase to keep the negative read bit line grounded. During the accumulation phase, switches S1 and S2 are opened to allow the positive and negative read bit lines to float. The read word line for each bitcell is asserted during the accumulation phase so that the reset transistor N5 in each bitcell switches on to ground the bitcell's capacitor node. Depending upon whether the positive and negative capacitors were charged or discharged, these capacitors will affect the voltages of their corresponding read bit lines accordingly. But this voltage change during the accumulation phase is differential so that the bias is advantageously removed.

Figure 6:
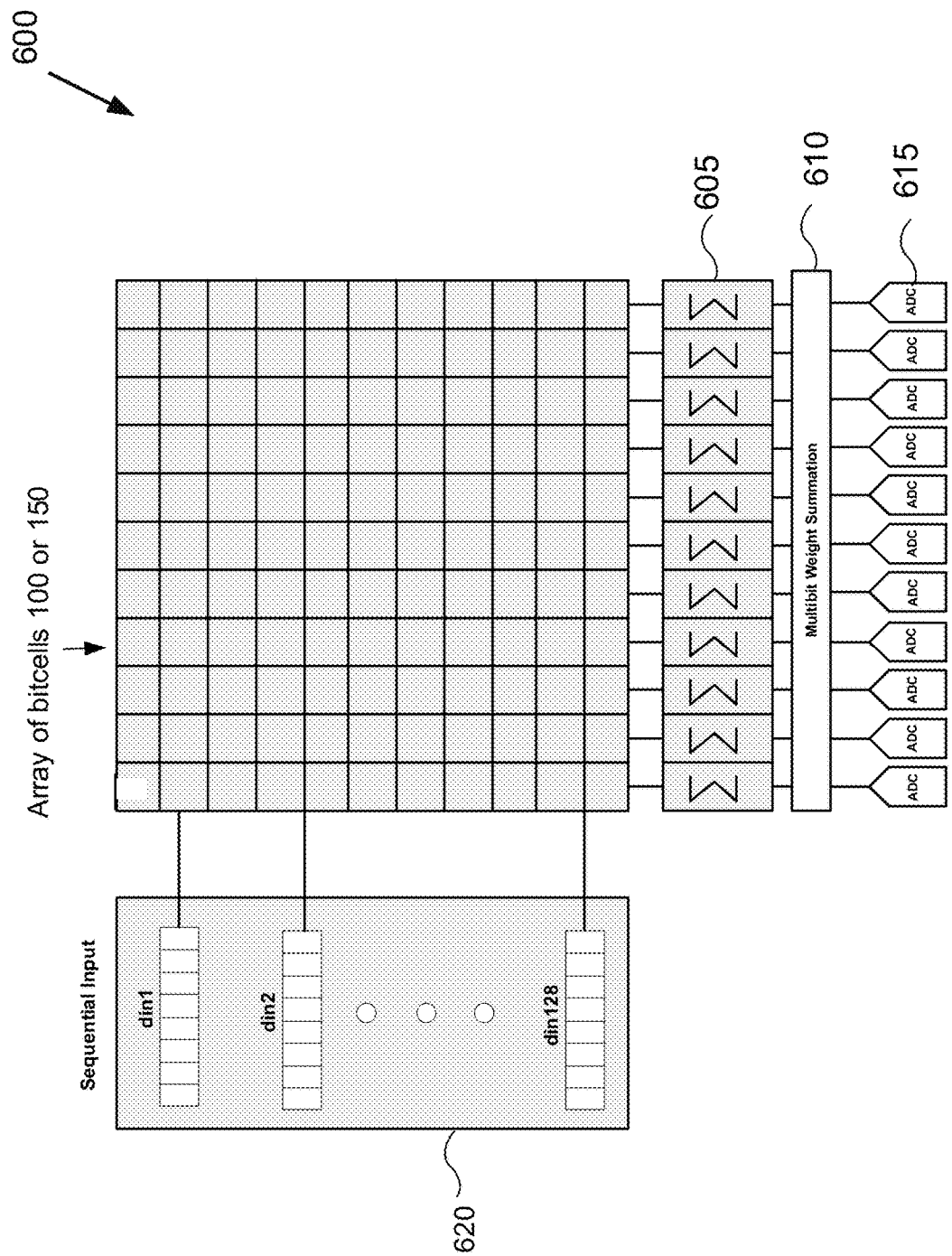
FIG. 6 illustrates a memory array of differential bitcells formed into a plurality of multiply-and-accumulate circuits in accordance with an aspect of the disclosure.

A plurality of MAC circuits may be arranged to form a memory array 600 as shown in FIG. 6. Each column of differential bitcells 100 or 150 forms a corresponding MAC circuit. For example, the filter size is 128 in array 600 so that each column in array 600 has 128 differential bitcells 100 or 150. An input vector 620 will thus have 128 activation bits, ranging from a first activation bit din1 to a $128^{th}$ activation bit din128. Input vector 620 sequentially changes so that each MAC circuit performs a reset phase, a calculation phase, and an accumulation phase as discussed with regard to MAC circuit 500 for each sample of input vector 620. Note that each input sample such as din1 may be a multi-bit input sample. For example, din1 may be a three-bit wide sample din1. Since each bitcell can only perform a binary multiplication, the various bits in the multi-bit input samples are sequentially processed by each MAC circuit in array 600. A sequential integrator 605 for each MAC circuit thus functions to weight the accumulation results according to the weight of the multi-bit input samples. For example, suppose each sample of input vector 620 is a three-bit-wide sample ranging from a least-significant bit (LSB) sample to a most-significant bit (MSB) sample. Each sequential integrator 605 thus sums the accumulation results according to their bit weight. In addition, the filter weights themselves may be multi-bit filter weights. Since each differential bitcell stores a binary filter weight, one MAC circuit may be used for one filter weight bit (e.g., the LSB weight), a neighboring MAC circuit may be used for the next-most-significant filter weight bit, and so on. In such an embodiment three adjacent MAC circuit would be used for a three-bit-wide filter weight embodiment. A multi-bit weight summation circuit 610 accumulates the corresponding MAC accumulation values (as processed through the corresponding sequential integrators 605 as necessary in the case of multi-bit input samples) and sums the MAC accumulation values according to the binary weights of the filter weight bits. Finally, an analog-to-digital converter (ADC) 615 digitizes the final accumulation result. This digitization is greatly simplified, however, due to the differential read bit line voltages for each MAC circuit that inherently cancels the neuron bias.

A flowchart for an example differential compute-in-memory method is shown in FIG. 7. The method includes an act 700 that occurs during a reset phase. Act 700 includes closing a first switch to connect a positive read bit line to a power supply node for a power supply voltage and closing a second switch to connect a negative read bit line to ground. The closing of switches S1 and S2 shown in FIG. 5 is an example of act 700. The method also includes an act 705 that occurs during the calculation phase and includes maintaining the first switch and the second switch in a closed state. Keeping switches S1 and S2 closed during the calculation phase is an example of act 705. The method further includes a calculation phase act 710 of, responsive to a binary product of a filter weight bit and an input bit being true, charging a second plate of a positive capacitor to the power supply voltage while a first plate of the positive capacitor is connected to the positive read bit line and discharging a second plate of a negative capacitor to ground while a first plate of the negative capacitor is connected to the negative read bit line. The charging of the capacitor node and the discharging of the complement capacitor node in bitcells 100 and 150 is an example of act 710. In addition, the method includes an accumulation phase act 715 of discharging the second plate of the positive capacitor while the first switch is opened to provide a first accumulation voltage on the positive read bit line. The switching on of the reset transistor N5 during the accumulation phase for bitcell 100 or the inversion of the negative capacitor node voltage by inverter 155 to discharge the positive capacitor node in bitcell 150 is an example of act 715. Finally, the method includes an accumulation phase act 720 of charging the second plate of the negative capacitor to the power supply voltage while the second switch is opened to provide a second accumulation voltage on the negative read bit line. The inversion of the discharged capacitor node through inverter 110 to charge the complement capacitor node during the accumulation phase for bitcell 100 or the charging of the negative capacitor node to the power supply voltage by the switching on of reset transistor P6 during the accumulation phase is an example of act 720.

Figure 8:
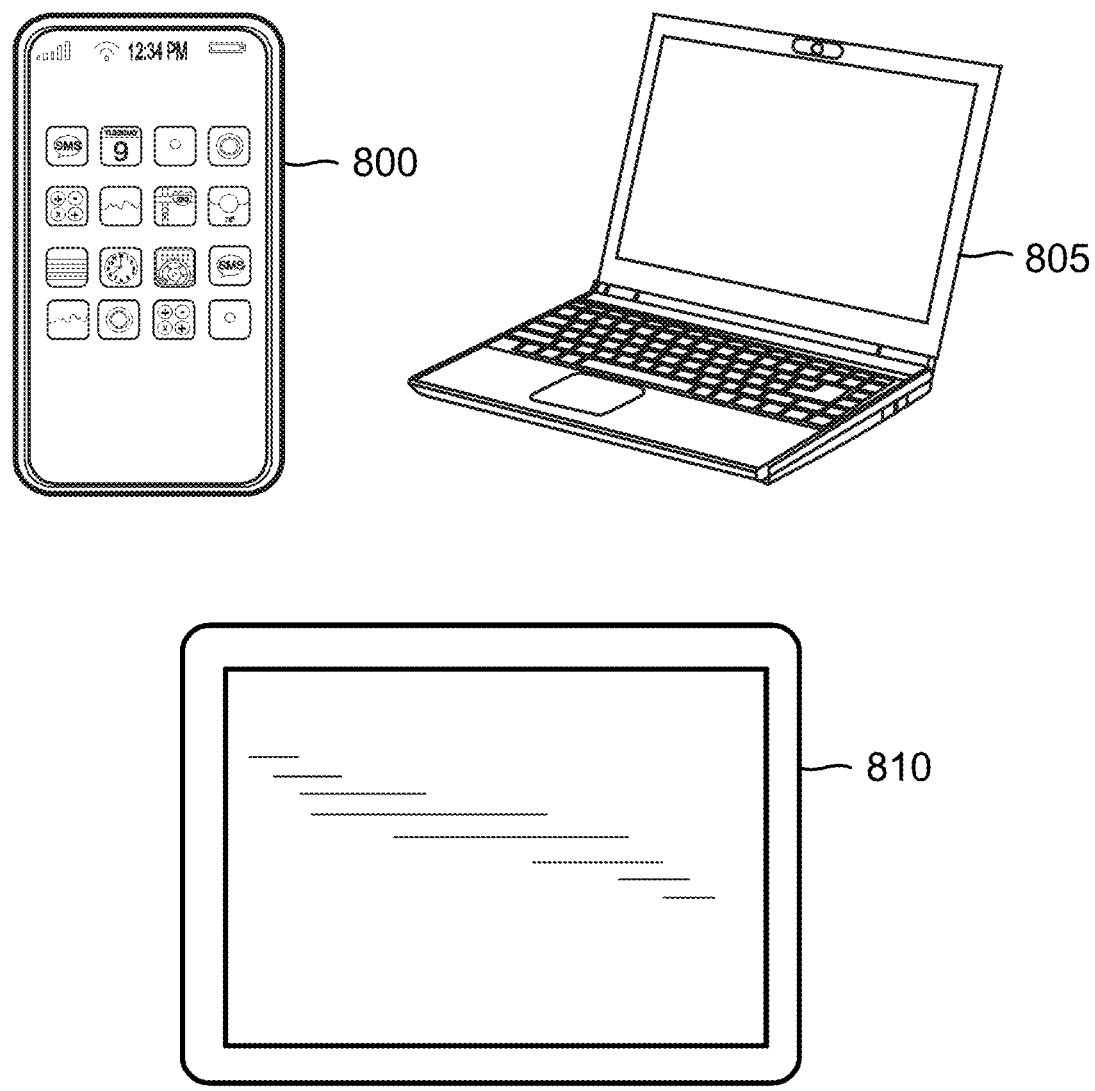
FIG. 8 illustrates some example electronic systems incorporating a memory array of differential compute-in-memory bitcells in accordance with an aspect of the disclosure.

A compute-in-memory bitcell as disclosed herein may be advantageously incorporated in any suitable mobile device or electronic system. For example, as shown in FIG. 8, a cellular telephone 800, a laptop computer 805, and a tablet PC 810 may all include a compute-in-memory having compute-in-memory bitcells such as for machine learning applications in accordance with the disclosure. Other exemplary electronic systems such as a music player, a video player, a communication device, and a personal computer may also be configured with compute-in-memories constructed in accordance with the disclosure.

Figure 9:
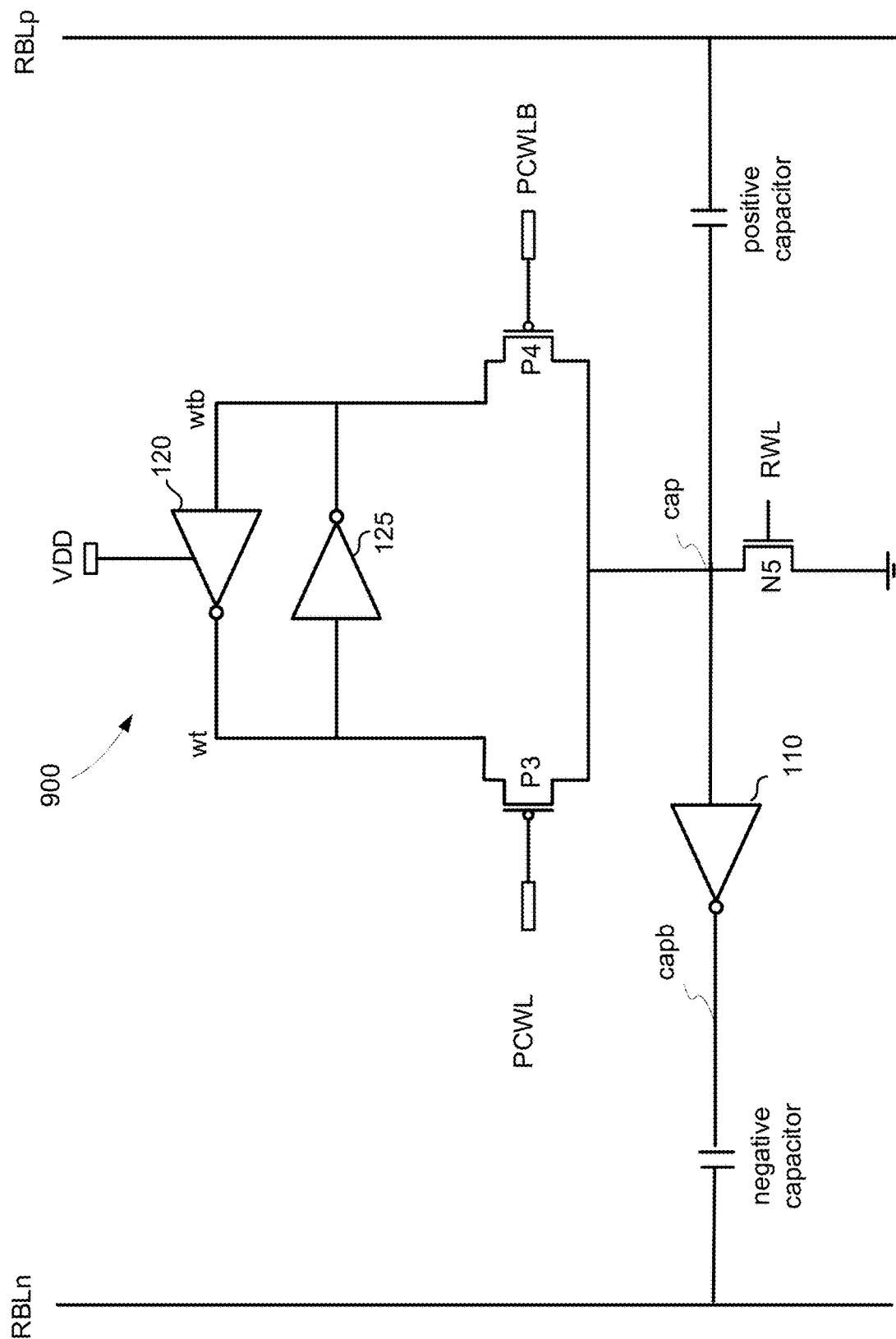
FIG. 9 illustrates a third differential compute-in-memory bitcell in accordance with an aspect of the disclosure.

Another example differential bitcell 900 is shown in FIG. 9. Bitcell 900 is substantially the same as bitcell 100 except that transmission gate T1 is replaced by just its transistor P3. Similarly, transmission gate T2 is replaced by just its transistor P4. Although the NMOS transistors N3 and N4 are thus eliminated, note that each transistor P3 and P4 will require its own poly line analogously as illustrated in FIG. 3. Transistors P1, N1, P2, N2, P3, P4, P5, and N6 may thus still have a six-poly line pitch for their layout. Although replacing transmission gates T1 and T2 by just their PMOS transistors P3 and P4 thus does not reduce density, the control of transistors P3 and P4 is simplified as a pre-charge word line PCWL controls the gate of transistor P3 in bitcell 900. Similarly, a complement pre-charge word line PCWLAB controls the gate of transistor P4 in bitcell 900. In contrast, bitcell 100 used four pre-charge word lines. In both bitcell 100 and bitcell 900, transistor P3 may be referred to as a first pass transistor. Similarly, transistor P4 may be referred to as a second pass transistor. It will be appreciated that bitcell 900 may instead be arranged analogously as discussed for bitcell 150.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A compute-in-memory bitcell, comprising:
   a pair of cross-coupled inverters having a first output node for a stored filter weight bit;
   a first read bit line;
   a second read bit line;
   a word line having a voltage responsive to an input bit;
   a first capacitor having a first plate connected to the first read bit line;
   a second capacitor having a first plate connected to the second read bit line;
   a first pass transistor connected between the first output node and a second plate of the first capacitor and having a gate connected to the word line; and
   an inverter having an input connected to the second plate of the first capacitor and having an output connected to a second plate of the second capacitor.

2. The compute-in-memory bitcell of claim 1, wherein the pair of cross-coupled inverters include a second output node for a complement of the stored filter weight bit; the compute-in-memory bitcell further comprising:
   a complement word line having a voltage responsive to a complement of the input bit;
   a second pass transistor connected between the second output node and the second plate of the first capacitor and having a gate connected to the complement word line.

3. The compute-in-memory bitcell of claim 2, wherein the first pass transistor and the second pass transistor are both p-type metal-oxide semiconductor (PMOS) transistors.

4. The compute-in-memory bitcell of claim 2, further comprising:
   a read word line; and
   a third transistor connected between the second plate of the first capacitor and ground and having a gate connected to the read word line.

5. The compute-in-memory bitcell of claim 4, wherein the third transistor is an n-type metal-oxide semiconductor (NMOS) transistor having a source connected to ground and a drain connected to the second plate of the first capacitor.

6. The compute-in-memory bitcell of claim 4, wherein the third transistor is a p-type metal-oxide semiconductor (PMOS) transistor having a source connected to a power supply node and a drain connected to the second plate of the first capacitor.

7. The compute-in-memory bitcell of claim 4, further comprising:
   a first switch connected between a power supply node for a power supply voltage and the first read bit line; and
   a second switch connected between ground and the second read bit line.

8. The compute-in-memory bitcell of claim 4, further comprising:
   a first switch connected between a power supply node for a power supply voltage and the second read bit line; and
   a second switch connected between ground and the first read bit line.

9. The compute-in-memory bitcell of claim 1, further comprising:
   a first transmission gate including the first pass transistor; and
   a second transmission gate including within the second pass transistor.

10. The compute-in-memory bitcell of claim 9, wherein the first transmission gate is configured to conduct responsive to the input bit being true.

11. The compute-in-memory bitcell of claim 9, wherein the second transmission gate is configured to conduct responsive to the input bit being false.

12. The compute-in-memory bitcell of claim 1, wherein the compute-in-memory bitcell is included within a column in an array of compute-in-memory bitcells.

13. The compute-in-memory bitcell of claim 1, wherein the first capacitor is selected from the group consisting of a metal-layer capacitor, a varactor, and a metal-insulator-metal capacitor.

14. The compute-in-memory bitcell of claim 4, wherein the third transistor is a thick-oxide transistor.

15. A compute-in-memory bitcell, comprising:
- a pair of cross-coupled inverters having a first output node for a stored bit;
- a first read bit line;
- a second read bit line;
- a first capacitor having a first plate connected to the first read bit line;
- a second capacitor having a first plate connected to the second read bit line;
- a first transmission gate connected between the first output node and a second plate of the first capacitor, wherein the first transmission gate is responsive to an input bit; and
- an inverter having an input connected to the second plate of the first capacitor and having an output connected to a second plate of the second capacitor.

16. The compute-in-memory bitcell of claim 15, wherein the pair of cross-coupled inverters include a second output node for a complement of the stored bit; the compute-in-memory bitcell further comprising:
- a second transmission gate connected between the second output node and the second plate of the first capacitor, wherein the second transmission gate is responsive to a complement of the input bit.

17. The compute-in-memory bitcell of claim 15, wherein the input bit is an active-low signal.

18. The compute-in-memory bitcell of claim 15, further comprising:
- a read word line; and
- a first transistor connected between the second plate of the first capacitor and ground and having a gate connected to the read word line.

19. The compute-in-memory bitcell of claim 18, wherein the first transistor is a n-type metal-oxide semiconductor (NMOS) transistor having a source connected to ground and a drain connected to the second plate of the first capacitor.

20. The compute-in-memory bitcell of claim 18, further comprising:
- a first switch connected between a power supply node for a power supply voltage and the first read bit line.

21. The compute-in-memory bitcell of claim 20, further comprising:
- a second switch connected between ground and the second read bit line.

22. The compute-in-memory bitcell of claim 21, wherein the first switch and the second switch are both configured to be closed during a reset phase for the compute-in-memory bitcell.

23. A multiply-and-accumulate circuit, comprising:
- a plurality of compute-in-memory bitcells arranged into a plurality of columns, wherein each column includes a first read bit line and a second read bit line, and wherein each compute-in-memory bitcell in each column includes:
- a logic gate configured to multiply an input bit with a stored bit;
- a first capacitor having a first plate connected to the column's first read bit line and having a second plate connected to an output node for the logic gate;
- a second capacitor having a first plate connected to the column's second read bit line; and
- an inverter having an input connected to the second plate of the first capacitor and having an output connected to a second plate of the second capacitor.

24. The multiply-and-accumulate circuit of claim 23, further comprising:
- a plurality of analog-to-digital converters corresponding to the plurality of columns on a one-to-one basis, each analog-to-digital converter configured to convert a differential voltage between the column's first read bit line and the column's second read bit line into a digital value.

25. The multiply-and-accumulate circuit of claim 24, wherein each analog-to-digital converter is a multi-bit analog-to-digital converter.

26. The multiply-and-accumulate circuit of claim 24, wherein each analog-to-digital converter is a successive-approximation-register analog-to-digital converter including a digital-to-analog converter.

27. A compute-in-memory method, comprising:
- during a reset phase, closing a first switch to connect a positive read bit line to a power supply node for a power supply voltage and closing a second switch to connect a negative read bit line to ground;
- during a calculation phase following the reset phase:
  - maintaining the first switch and the second switch in a closed state; and
  - responsive to a binary product of a filter weight bit and an input bit being true, charging the second plate of a positive capacitor to the power supply voltage while a first plate of the positive capacitor is connected to the positive read bit line and discharging a second plate of a negative capacitor to ground while a first plate of the negative capacitor is connected to the negative read bit line;
- during an accumulation phase following the calculation phase:
  - discharging the second plate of the positive capacitor while the first switch is opened to provide a first accumulation voltage on the charged positive read bit line; and
  - charging the second plate of the negative capacitor to the power supply voltage while the second switch is opened to provide a second accumulation voltage on the discharged negative read bit line.

28. The compute-in-memory method of claim 27, further comprising:
- during the calculation phase following the reset phase:
  - responsive to the binary product being false, discharging the second plate of the positive capacitor to ground and charging the second plate of the negative capacitor to the power supply voltage.

* * * * *